(12) United States Patent
Hida et al.

(10) Patent No.: US 7,501,740 B2
(45) Date of Patent: Mar. 10, 2009

(54) MICROSCALE DRIVING UNIT AND RECORDING DISK DRIVE

(75) Inventors: Masaharu Hida, Kawasaki (JP); Tsuyoshi Mita, Kawasaki (JP); Kazuaki Kurihara, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 273 days.

(21) Appl. No.: 11/033,311

(22) Filed: Jan. 12, 2005

(65) Prior Publication Data

US 2005/0151447 A1 Jul. 14, 2005

Related U.S. Application Data

(63) Continuation of application No. PCT/JP02/13821, filed on Dec. 27, 2002.

(51) Int. Cl.
*H01L 41/08* (2006.01)
(52) U.S. Cl. ...................................................... 310/328
(58) Field of Classification Search ................. 310/328, 310/311, 323.01, 323.17; 360/294.6, 292, 360/294.4–294.5; *H01L 41/08*
See application file for complete search history.

(56) References Cited

U.S. PATENT DOCUMENTS

| | | | |
|---|---|---|---|
| 4,455,501 A | 6/1984 | Tojo et al. | |
| 6,233,124 B1 * | 5/2001 | Budde et al. | 360/294.4 |
| 6,327,120 B1 | 12/2001 | Koganezawa et al. | 360/294.4 |
| 6,335,849 B1 * | 1/2002 | Khan et al. | 360/294.4 |
| 6,376,964 B1 | 4/2002 | Young et al. | |
| 6,538,854 B2 | 3/2003 | Koganezawa et al. | 360/294.4 |
| 6,653,761 B2 | 11/2003 | Fujii et al. | 310/333 |
| 6,704,158 B2 | 3/2004 | Hawwa et al. | |
| 6,760,196 B1 | 7/2004 | Niu et al. | |
| 6,848,154 B2 | 2/2005 | Fujii et al. | 29/25.35 |

(Continued)

FOREIGN PATENT DOCUMENTS

EP 0 085 745 B1 8/1983

(Continued)

OTHER PUBLICATIONS

Japan Office Action dated Oct. 30, 2007 w/English translation.

(Continued)

*Primary Examiner*—Quyen P Leung
*Assistant Examiner*—Karen B Addison
(74) *Attorney, Agent, or Firm*—Kratz, Quintos & Hanson, LLP.

(57) ABSTRACT

A microscale driving unit includes first and second elongated piezoelectric actuators extending in antiparallel directions. The base ends of the actuators are fixed to a support member. The tip ends of the actuators are fixed to a driven member. First and second electrically conductive members connect the base end of the first or second elongated piezoelectric actuator to the tip end of the second or first elongated piezoelectric actuator. The microscale driving unit allows utilization of a common single wiring pattern connected to both the base end of the first elongated piezoelectric actuator and the tip end of the second elongated piezoelectric actuator when a driving current is supplied to the first and second elongated piezoelectric actuators. Only a smaller area should be required to locate the wiring pattern. A sufficient planar space can be obtained on the surface of the support member.

6 Claims, 7 Drawing Sheets

U.S. PATENT DOCUMENTS

| | | | |
|---|---|---|---|
| 7,068,473 B2 * | 6/2006 | O'Neill | 360/294.4 |
| 7,414,353 B2 * | 8/2008 | Hida et al. | 310/328 |
| 2005/0104477 A1 | 5/2005 | Fujii et al. | 310/328 |

FOREIGN PATENT DOCUMENTS

| | | |
|---|---|---|
| JP | 58-190080 | 11/1983 |
| JP | 1-78060 | 5/1989 |
| JP | 10-136665 | 5/1998 |
| JP | 10-144974 | 5/1998 |
| JP | 11-31368 * | 2/1999 |
| JP | 2001-67823 | 3/2001 |
| JP | 2001-320102 | 11/2001 |
| JP | 2002-142476 | 5/2002 |
| JP | 2003-59219 | 2/2003 |
| WO | WO 02/087063 A1 | 10/2002 |

OTHER PUBLICATIONS

Japan Office Action dated Mar. 11, 2008.

* cited by examiner

MICROSCALE DRIVING UNIT AND RECORDING DISK DRIVE

This application is a continuation of international application PCT/JP02/013821 filed Dec. 27, 2002.

BACKGROUND OF THE INVENTION

1. Field of the Invention

The present invention relates to a microscale driving unit including a first elongated piezoelectric actuator extending in a first direction to a movable end from a base end fixed to a support member and a second elongated piezoelectric actuator extending in a second direction to a movable end from a base end fixed to the support member.

2. Description of the Prior Art

A microscale driving unit is well known. The microscale driving unit is incorporated in a head assembly in a hard disk drive (HDD). A pair of piezoelectric actuator of the microscale driving unit is interposed between the head suspension and the head slider, for example. A driving current is independently supplied to the individual piezoelectric actuator.

Wire patterns are separately connected to the individual piezoelectric actuators for supply of the driving current. The wiring patterns are formed on the surface of the head suspension. The wiring patterns are jammed in a limited planar space. In particular, the head assembly of the HDD must enable arrangement of various wiring patterns on the surface of the head suspension. Such wiring patterns includes ones for supplying electric current to an electromagnetic transducer writing magnetic information data and for supplying a sensing current to an electromagnetic transducer reading magnetic information data. Only a reduced space is available for the wiring patterns connected to the piezoelectric actuators.

SUMMARY OF THE INVENTION

It is accordingly an object of the present invention to provide a microscale driving unit enabling a reliable supply of a driving current to individual piezoelectric actuators with a simple structure.

According to a first aspect of the present invention, there is provided a microscale driving unit comprising: a support member; a driven member; a first elongated piezoelectric actuator extending in a first direction from a base end fixed to the support member, said first elongated piezoelectric actuator being fixed to the driven member at the tip end of the actuator; a second elongated piezoelectric actuator extending in a second direction from a base end fixed to the support member, said second elongated piezoelectric actuator being fixed to the driven member at the tip end of the actuator, said second direction being set antiparallel to the first direction; a first electrically conductive member connecting the base end of the first elongated piezoelectric actuator to the tip end of the second elongated piezoelectric actuator; and a second electrically conductive member connecting the base end of the second elongated piezoelectric actuator to the tip end of the first elongated piezoelectric actuator.

The microscale driving unit allows utilization of a common single wiring pattern connected to both the base end of the first elongated piezoelectric actuator and the tip end of the second elongated piezoelectric actuator when a driving current is supplied to the first and second elongated piezoelectric actuators. A common single wiring pattern is likewise connected to both the base end of the second elongated piezoelectric actuator and the tip end of the first elongated piezoelectric actuator. As compared with the case where wiring patterns are individually connected to the piezoelectric actuators, only a smaller area should be required to locate the wiring pattern. The wiring pattern can be jammed in a limited space in an efficient manner. A sufficient planar space can be obtained on the surface of the support member. The microscale driving unit allows a reliable supply of the driving current to the individual elongated piezoelectric actuators with a simple structure. The elongated piezoelectric actuator may further comprise: a first terminal electrode attached to the exposed end near the base end; and a second terminal electrode attached to the exposed end near the tip end. The electrically conductive members may be made of wire bonding materials. Wire bonding method may be employed to form the electrically conductive members, for example.

For example, the elongated piezoelectric actuator may be made of a layered material. The layered material may comprise: first inside electrode layers extending from exposed ends near the base end toward the tip end; second inside electrode layers extending from exposed ends near the tip end toward the base end between the adjacent ones of the first inside electrode layers; and active layers interposed between the first and second inside electrode layers. When a driving current is supplied to the active layers, the active layers get shrunk based on a so-called lateral effect along the first and second inside electrode layers. The shrinkage of the piezoelectric actuators is thus realized. The amount of the shrinkage can be set dependent on the amplitude of the applied voltage. The active layers may be made of a piezoelectric material such as PNN-PT-PZ.

The first and second elongated piezoelectric actuators may be arranged symmetrically around a rotational axis of the driven member. When the first and second elongated piezoelectric actuators get shrunk in the microscale driving unit, the tip ends are pulled closer to the corresponding base ends in the first and second elongated piezoelectric actuators. A couple is thus generated around the rotational axis. The driven member thus receives the driving force for rotation around the rotational axis based on the generated couple. The driving force causes a change in the attitude of the driven member.

According to a second aspect of the present invention, there is provided a microscale driving unit comprising: a support member; a first elongated piezoelectric actuator extending in a first direction to a movable end from a base end fixed to the support member; a second elongated piezoelectric actuator extending in a second direction to a movable end from a base end fixed to the support member; and a wire bonding material connecting the base end of the first elongated piezoelectric actuator to the movable end of the elongated piezoelectric actuator.

The microscale driving unit allows utilization of a common single wiring pattern connected to both the base end of the first elongated piezoelectric actuator and the movable end of the second elongated piezoelectric actuator when a driving current is supplied to the first and second elongated piezoelectric actuators. As compared with the case where wiring patterns are individually connected to the piezoelectric actuators, only a smaller area should be required to locate the wiring pattern. The wiring pattern can be jammed in a limited space in an efficient manner. A sufficient planar space can be obtained on the surface of the support member. The microscale driving unit allows a reliable supply of the driving current to the individual elongated piezoelectric actuators with a simple structure. In addition, the microscale driving unit allows deformation of the wire bonding material so as to realize a sufficient displacement or movement of the movable end.

The elongated piezoelectric actuator may be made of a layered material in the same manner as described above. The layered material comprising: first inside electrode layers extending from exposed ends near the base end toward the movable end; second inside electrode layers extending from exposed ends near the movable end toward the base end between the adjacent ones of the first inside electrode layers; and active layers interposed between the first and second inside electrode layers. Shrinkage of the piezoelectric actuators are thus realized. The active layers may be made of a piezoelectric material such PNN-PT-PZ, for example.

The aforementioned microscale driving unit may be utilized in a head assembly for a recording medium drive such as a hard disk drive (HDD). The head assembly allows interposal of the first and second elongated piezoelectric actuators between a support member such as a head suspension and a driven member such as a head slider.

BRIEF DESCRIPTION OF THE DRAWINGS

The above and other objects, features and advantages of the present invention will become apparent from the following description of the preferred embodiments in conjunction with the accompanying drawings, wherein.

DESCRIPTION OF THE PREFERRED EMBODIMENTS

Figure 1:
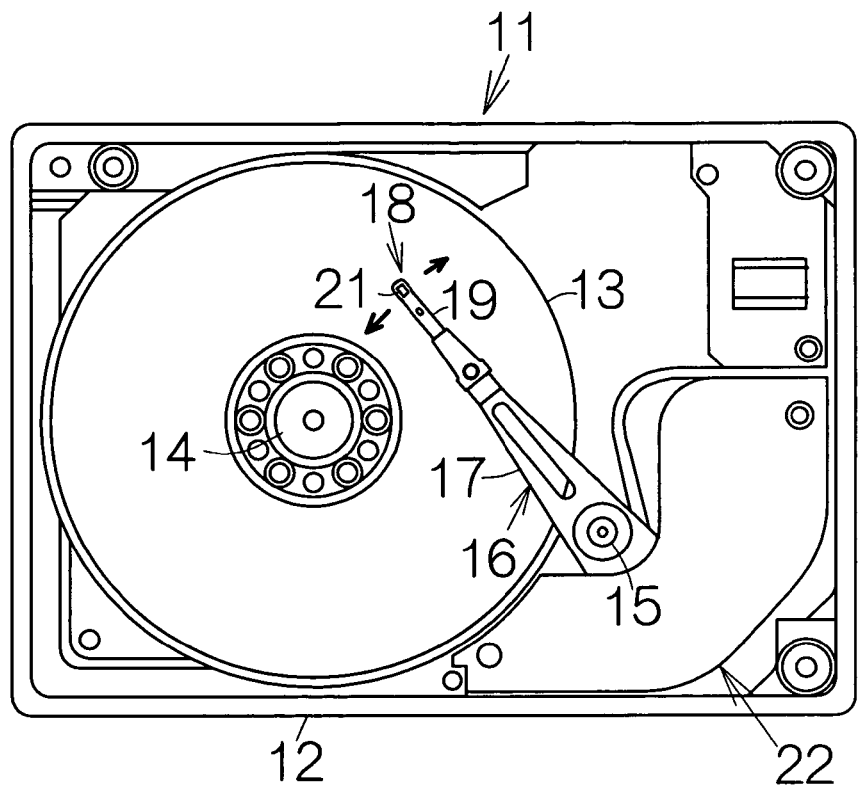
FIG. 1 is a plan view schematically illustrating the structure of a hard disk drive (HDD) as an example of a recording medium drive.

FIG. 1 schematically illustrates the inner structure of a hard disk drive (HDD) 11 as an example of a recording medium drive or storage device. The HDD 11 includes a box-shaped main enclosure 12 defining an inner space of a flat parallelepiped, for example. At least one magnetic recording disk 13 is incorporated in the inner space within the main enclosure 12. The magnetic recording disk 13 is mounted on the driving shaft of a spindle motor 14. The spindle motor 14 is allowed to drive the magnetic recording disk 13 for rotation at a higher revolution speed such as 7,200 rpm or 10,000 rpm, for example. A cover, not shown, is coupled to the main enclosure 12 so as to define the closed inner space between the main enclosure 12 and itself.

A carriage 16 is also incorporated within the inner space of the main enclosure 12. The carriage 16 is designed to swing around a vertical support shaft 15. The carriage 16 includes rigid actuator arms 17 extending in a horizontal direction from the vertical support shaft 15, and microscale driving units or head suspension assemblies 18 attached to the tip or front ends of the actuator arms 17. A head suspension 19 is allowed to extend forward from the front end of the actuator arm 17 in the individual head suspension assembly 18. As conventionally known, a flying head slider 21 is supported at the front end of the head suspension 19. The head suspension 19 serves as a support member of the present invention.

The head suspension 19 serves to generate an urging force on the flying head slider 21 toward the surface of the magnetic recording disk 13. When the magnetic recording disk 13 rotates, the flying head slider 21 is allowed to receive airflow generated along the rotating magnetic recording disk 13. The airflow serves to generate a lift on the flying head slider 21. The flying head slider 21 is thus allowed to keep flying above the surface of the magnetic recording disk 13 during the rotation of the magnetic recording disk 13 at a higher stability established by the balance between the lift and the urging force from the head suspension 19.

When the carriage 16 is driven to swing about the support shaft 15 during the flight of the flying head slider 21, the flying head slider 21 is allowed to cross the recording tracks defined on the magnetic recording disk 13 in the radial direction of the magnetic recording disk 13. This radial movement serves to position the flying head slider 21 right above a target recording track on the magnetic recording disk 13. In this case, an actuator 22 such as a voice coil motor (VCM) can be employed to realize the swinging movement of the carriage 16, for example. As conventionally known, in the case where two or more magnetic recording disks 13 are incorporated within the inner space of the main enclosure 12, a pair of the head suspension assembly 18, namely a pair of the flying head slider 21, is disposed between the adjacent magnetic recording disks 13.

Figure 2:
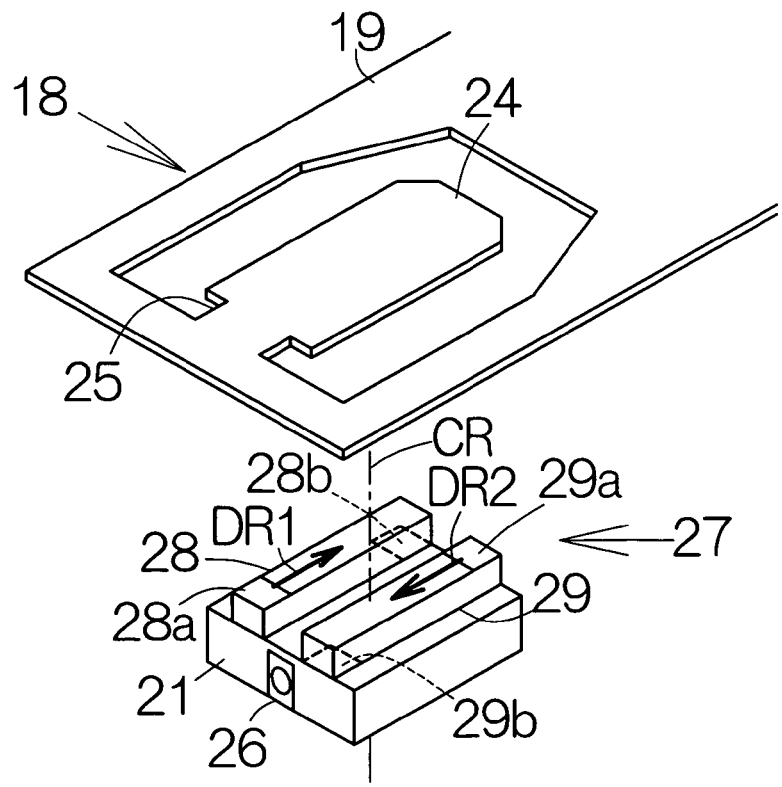
FIG. 2 is an enlarged partial perspective view illustrating the structure of a head suspension assembly in detail.

As shown in FIG. 2, a plate member 24 is punched out at the front end of the head suspension 19 in the head suspension assembly 18. The plate member 24 may be punched out of a material for the flexure 23. The plate member 24 is allowed to change its attitude through the action of a so-called gimbal spring 25. The flying head slider 21 as a driven member is received on the surface of the plate member 24. A read/write electromagnetic transducer or head 26 is mounted on the flying head slider 21. The read/write electromagnetic transducer 26 may include a write element, such as a thin film magnetic head, utilized to write information data into the magnetic recording disk 13 and a read element, such as giant magnetoresistive (GMR) element or a tunnel-junction magnetoresistive (TMR) element, utilized to read magnetic bit data out of the magnetic recording disk 13, for example.

A piezoelectric actuator set 27 is interposed between the flying head slider 21 and the plate member 24. The piezoelectric actuator set 27 includes a first elongated piezoelectric actuator 28 extending in a first direction DR1 from a base end 28a. The base end 28a of the first elongated piezoelectric actuator 28 is fixed to the plate member 24. The movable end or tip end 28*b* of the first elongated piezoelectric actuator 28 is fixed to the flying head slider 21.

The piezoelectric actuator set 27 likewise includes a second elongated piezoelectric actuator 29 extending in a second direction DR2 from a base end 29*a*. The base end 29*a* of the second elongated piezoelectric actuator 29 is fixed to the plate member 24. The movable end or tip end 29*b* of the second elongated piezoelectric actuator 29 is fixed to the flying head slider 21. The second direction DR2 is set antiparallel to the first direction DR1. An adhesive including epoxy resin may be employed to fix the piezoelectric actuators 28, 29 to the plate member 24 as well as to the flying head slider 21.

Figure 3:
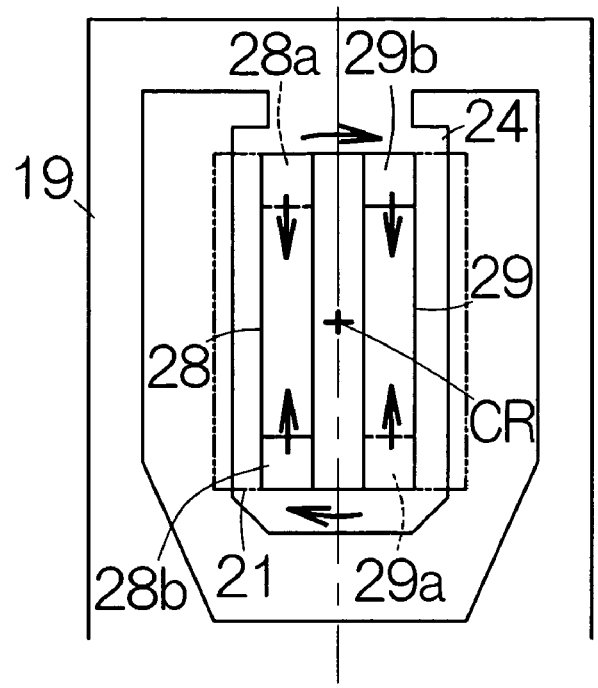
FIG. 3 is an enlarged plan view of a plate member for illustrating the location of first and second elongated piezoelectric actuators.

As is apparent from FIG. 3, the first and second elongated piezoelectric actuators 28, 29 are arranged symmetrically to each other around a predetermined rotational axis CR set perpendicular to the upper surface of the flying head slider 21, for example. When the first and second elongated piezoelectric actuators 28, 29 both get shrunk, the tip ends 28*b*, 29*b* are pulled closer to the corresponding base ends 28*a*, 29*a* in the first and second elongated piezoelectric actuators 28, 29, respectively. A couple is generated around the rotational axis CR. The flying head slider 21 thus receives the driving force for rotation around the rotational axis CR based on the generated couple. The attitude of the flying head slider 21 can be changed around the rotational axis CR based on the application of the driving force.

Figure 4:
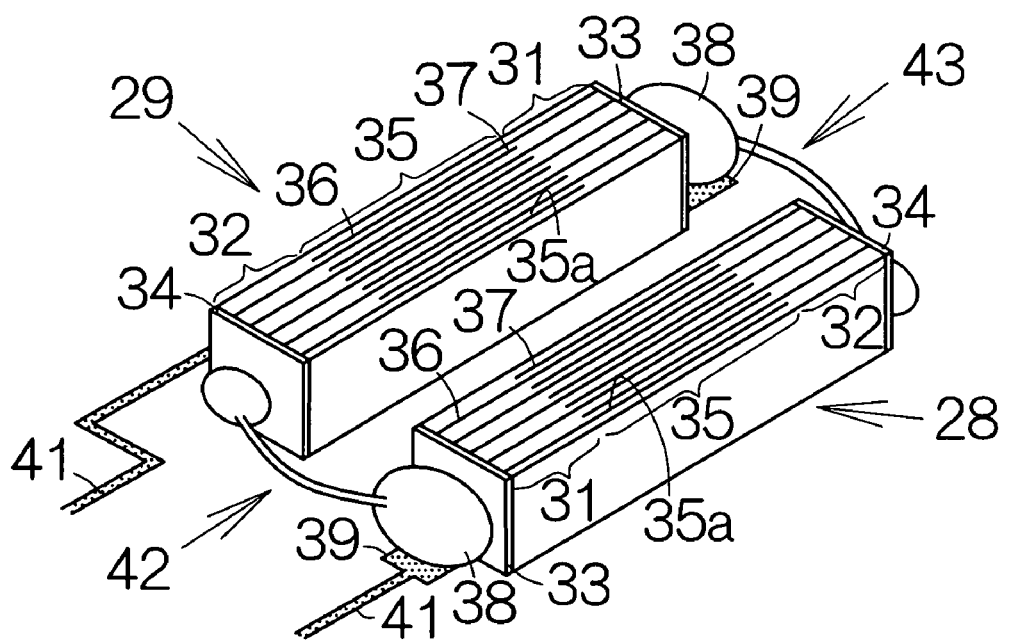
FIG. 4 is an enlarged perspective view schematically illustrating the structure of the elongated piezoelectric actuators on the plate member.

As shown in FIG. 4, the first elongated piezoelectric actuator 28 according to a first embodiment of the present invention includes a first piezoelectric ceramic block 31 forming the base end 28*a* of the first elongated piezoelectric actuator 28, and a second piezoelectric ceramic block 32 likewise forming the tip end 28*b* of the first elongated piezoelectric actuator 28. A first terminal electrode layer 33 is coupled to the end surface near the base end 28*a* in the first elongated piezoelectric actuator 28, namely, an exposed end of the first piezoelectric ceramic block 31. Likewise, a second terminal electrode layer 34 is coupled to the end surface near the tip end 28*b* in the first elongated piezoelectric actuator 28, namely, an exposed end of the second piezoelectric ceramic block 32. The first and second terminal electrode layers 33, 34 may be made of an electrically conductive metallic material such as Pt, for example.

A stack 35 of piezoelectric ceramic layers 35*a* is interposed between the first and second piezoelectric ceramic blocks 31, 32. First and second inside electrode layers 36, 37 are alternately sandwiched between the adjacent ones of the piezoelectric ceramic layers 35*a* in the stack 35. The first inside electrode layers 36 are designed to penetrate through the first piezoelectric ceramic block 31 so as to reach the exposed end or outer end surface of the first piezoelectric ceramic block 31. The outer ends of the first inside electrode layers 36 are thus connected to the first terminal electrode layer 33. The first inside electrode layers 36 are kept outside the second piezoelectric ceramic block 32. Likewise, the second inside electrode layers 37 are designed to penetrate through the second piezoelectric ceramic block 32 so as to reach the exposed end or outer end surface of the second piezoelectric ceramic block 32. The outer ends of the second inside electrode layers 37 are thus connected to the second terminal electrode layer 34. The second inside electrode layers 37 are kept outside the first piezoelectric ceramic block 31. The piezoelectric ceramic layers 35*a* between the first and second inside electrode layers 36, 37 correspond to active layers according to the present invention. The first and second piezoelectric ceramic blocks 31, 32 as well as the piezoelectric ceramic layers 35*a* may be made of a piezoelectric material such as PNN-PT-PZ, for example. The first and second inside electrode layers 36, 37 may be made of an electrically conductive metallic material such as Pt, for example.

The first terminal electrode layer 33 is designed to stand upright from the surface of the plate member 24 at the base end 28*a* adjacent the first piezoelectric ceramic block 31. A connecting terminal 38 of an electrically conductive material is attached to the exposed surface of the first terminal electrode layer 33. Gold wire bonding may be employed to attach the connecting terminal 38. An electrically conductive terminal pad 39 is located on the surface of the plate member 24. The connecting terminal 38 is received on the terminal pad 39 on the plate member 24. An electrically conductive wiring pattern 41 is connected to the terminal pad 39. The wiring pattern 41 is designed to extend along the surface of the head suspension 19. The wiring pattern 41 may be connected to a controller chip, not shown, in the HDD 11, for example. The second elongated piezoelectric actuator 29 have the structure identical to that of the first elongated piezoelectric actuator 28.

The second terminal electrode layer 34 of the second elongated piezoelectric actuator 29 is connected to the first terminal electrode layer 33 of the first elongated piezoelectric actuator 28 through a first electrically conductive material 42. Electric connection is thus established between the second elongated piezoelectric actuator 29 and the first elongated piezoelectric actuator 28. Likewise, the second terminal electrode layer 34 of the first elongated piezoelectric actuator 28 is connected to the first terminal electrode layer 33 of the second elongated piezoelectric actuator 29 through a second electrically conductive material 43. The first and second electrically conductive materials 42, 43 may be made of a wire bonding material such as a gold wire, for example. The first and second electrically conductive materials 42, 43 are allowed to bend between the connecting terminal 38 and the second terminal electrode layer 34.

Now, assume that a driving current of a predetermined voltage is supplied to the connecting terminal 38 of the first piezoelectric actuator 28 through the wiring pattern 41. The driving current is transmitted to the second terminal electrode layer 34 from the first terminal electrode layer 33 in the first elongated piezoelectric actuator 28. The driving current is likewise transmitted to the second terminal electrode layer 34 from the first terminal electrode layer 33 in the second elongated piezoelectric actuator 29. The individual piezoelectric ceramic layer 35*a* is allowed to receive the field intensity, of approximately 1 kV/mm, for example, between the first and second inside electrode layers 36, 37. The applied voltage serves to generate polarization, corresponding to the direction of the applied voltage, in the individual piezoelectric ceramic layer 35*a*. When the driving current is further supplied to the individual piezoelectric ceramic layer 35*a* subsequent to the polarization, the piezoelectric ceramic layer 35*a* gets shrunk in the d31 direction, which is the direction perpendicular to the direction of the polarization, based on a so-called lateral effect. The first and second elongated piezoelectric actuators 28, 29 simultaneously get shrunk.

When no driving current is supplied to the piezoelectric actuator set 27, the piezoelectric actuator set 27 serves to establish the standard attitude of the flying head slider 21 on the plate member 24, as shown in FIG. 3, for example. When the voltage is applied to the first and second elongated piezoelectric actuators 28, 29, the first and second elongated piezoelectric actuators 28, 29 both get shrunk in the aforementioned manner. The tip ends 28*b*, 29*b* are pulled closer to the base ends 28*a*, 29*a* in the first and second elongated piezoelectric actuators 28, 29. Here, the deformation of the first and second electrically conductive materials 42, 43 allows the displacement or movement of the tip ends or movable ends 28b, 29b. The action of the first and second elongated piezoelectric actuators 28, 29 generates a couple around the rotational axis CR. The generated couple causes the rotation of the flying head slider 21 around the rotational axis CR only in a predetermined direction from the standard attitude. In this manner, the attitude of the flying head slider 21 can be changed on the plate member 24. When the supply of the driving current is terminated, the first and second elongated piezoelectric actuators 28, 29 are allowed to elongate until they return to the original forms. The flying head slider 21 thus reverts to the standard attitude around the rotational axis CR.

Now, assume that the read/write electromagnetic transducer 26 on the flying head slider 21 is to be positioned on a specific recording track on the magnetic recording disk 13. In this case, the controller chip of the HDD 11 is set to supply a driving current in a range between 0V and 30V, for example, to the first and second elongated piezoelectric actuators 28, 29. When the maximum voltage of 30V is applied to the first and second elongated piezoelectric actuators 28, 29, the first and second elongated piezoelectric actuators 28, 29 shrink by the maximum amount. Here, the read/write electromagnetic transducer 26 is allowed to move or shift on the plate member 24 in the lateral direction perpendicular to the recording track by the maximum linear amount or stroke of approximately 1.0 μm.

Figure 5:
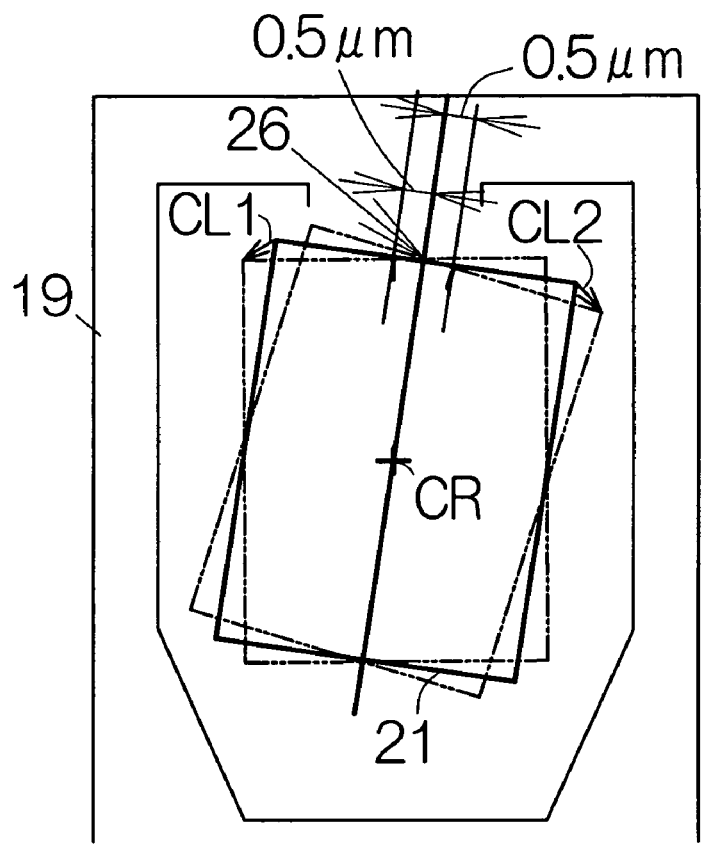
FIG. 5 is an enlarged plan view schematically illustrating the action of a flying head slider.

Prior to commencement of positioning the read/write electromagnetic transducer 26, the driving current of 15V is supplied to the piezoelectric actuator set 27. Accordingly, the read/write electromagnetic transducer 26 is moved on the plate member 24 by a half of the maximum stroke, namely, the stroke of 0.5 μm, as shown in FIG. 5, for example. Thereafter, the read/write electromagnetic transducer 26 is positioned above the target recording track based on the swinging movement of the carriage 16 or swinging arm 17.

When the read/write electromagnetic transducer 26 starts following the target recording track, the controller chip supplies the driving current to the piezoelectric actuator set 27 based on the servo control. When the voltage of the driving current is reduced below 15V, the first and second elongated piezoelectric actuators 28, 29 get elongated. The flying head slider 21 is thus driven to rotate around the rotational axis CR in the counterclockwise direction CL1. This rotation of the flying head slider 21 allows the read/write electromagnetic transducer 26 to move in the radial direction of the magnetic recording disk 13. When the voltage of the driving current is raised over 15V, the first and second elongated piezoelectric actuators 28, 29 get shrunk. The flying head slider 21 is thus driven to rotate around the rotational axis CR in the clockwise direction CL2. This rotation of the flying head slider 21 allows the read/write electromagnetic transducer 26 to move in the opposite direction along the radial direction of the magnetic recording disk 13. In this manner, the read/write electromagnetic transducer 26 is forced to follow the target recording track at a higher accuracy.

The head suspension assembly 18 utilizes the rotation of the flying head slider 21 so as to accomplish a fine or smaller movement of the read/write electromagnetic transducer 26. The moment of inertia can be reduced in the flying head slider 21 during rotation. Only a smaller moment acts on the individual elongated piezoelectric actuator 28, 29, so that the natural frequency can be raised in the vibration system comprising the flying head slider 21 and the piezoelectric actuator set 27. The frequency of the servo signal can be set over a wider frequency range. To the contrary, in the case where the flying head slider 21 is moved based on a swinging movement, the overall mass of the flying head slider 21 contributes to generation of the moment of inertia. In addition, the distance is increased between the center of mass and the center of trajectory. A larger moment of inertia is forced to act on the flying head slider 21. The servo signal tends to generate the resonance at a relatively lower frequency range.

Moreover, the head suspension assembly 18 solely utilizes a pair of the elongated piezoelectric actuator 28, 29 so as to realize the rotation of the flying head slider 21. The structure of the head suspension assembly 18 can be simplified. Here, if piezoelectric actuators are utilized to drive a head slider around the rotational axis at four independent points, as disclosed in the International Application No. PCT/JP01/02147, the natural frequency can be raised in the vibration system comprising the head slider and the piezoelectric actuators. However, an increased number of the connecting terminals tends to induce a complicated structure of the piezoelectric actuators in this case.

Furthermore, a common single wiring pattern is connected to both the first terminal electrode layer 33 of the first elongated piezoelectric actuator 28 and the second terminal electrode layer 34 of the second elongated piezoelectric actuator 29. A common single wiring pattern is likewise connected to both the first terminal electrode layer 33 of the first elongated piezoelectric actuator 28 and the second terminal electrode layer 34 of the second elongated piezoelectric actuator 29. As compared with the case where wiring patterns are individually connected to the terminal electrode layers 33, 34, only a smaller area should be required to locate the wiring pattern. The wiring pattern can be jammed in a limited space in an efficient manner. A sufficient space can be obtained on the surface of the head suspension assembly 18 for a wiring pattern utilized to supply electric current to the read/write electromagnetic transducer 26 when magnetic information data is to be written. A sufficient space can be obtained on the surface of the head suspension assembly 18 for a wiring pattern utilized to supply a sensing current to the read/write electromagnetic transducer 26 when magnetic information data is to be read. The head suspension assembly 18 allows a reliable supply of the driving current to the individual elongated piezoelectric actuators 28, 29 with a simple structure.

Figure 6:
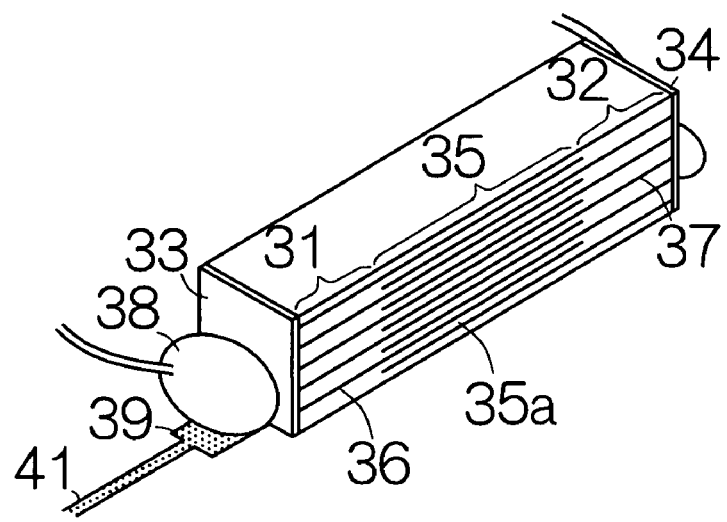
FIG. 6 is an enlarged perspective view schematically illustrating the structure of a piezoelectric actuator according to a modified example of the first embodiment.

It should be noted that the piezoelectric ceramic layers 35a of the first and second elongated piezoelectric actuators 28, 29 may be stacked in the direction perpendicular to the surface of the plate member 24 in the head suspension assembly 18, as shown in FIG. 6, for example.

Figure 7:
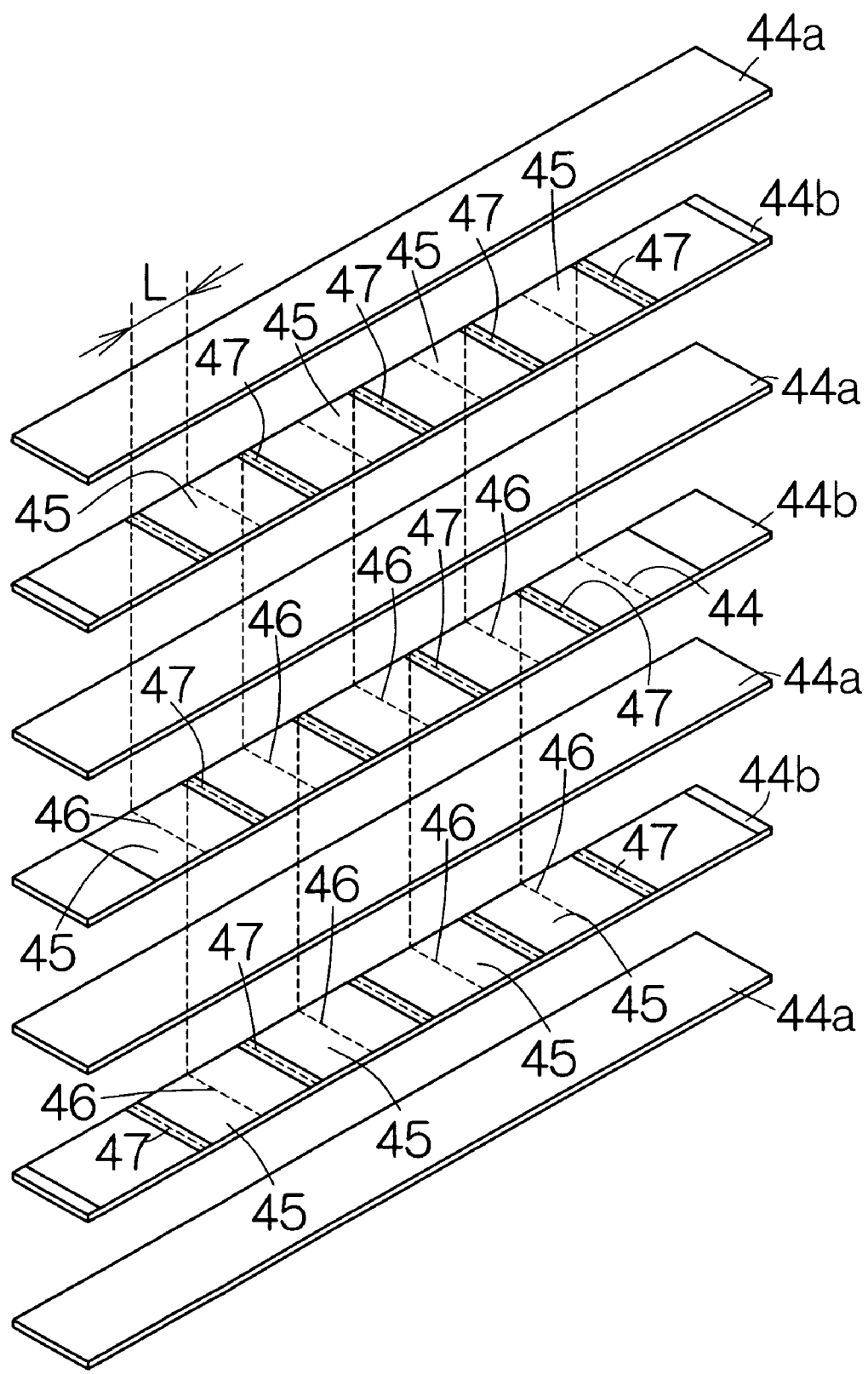
FIG. 7 is a perspective view schematically illustrating first and second green sheet strips employed in making the piezoelectric actuator.

Next, a brief description will be made on a method of making the elongated piezoelectric actuators 28, 29. As shown in FIG. 7, first and second green sheet strips 44a, 44b are first prepared. The first and second green sheet strips 44a, 44b have the identical shape. The thickness of the green sheet strips 44a, 44b may be set at approximately 20 μm, for example. The green sheet strips 44a, 44b may be made from the powder of a piezoelectric material such as PNN-PT-PZ, for example. Thin films 45 of an electrically conductive material, such as Pt, are added to the surface of the individual second green sheet strip 44b. In this case, powders of PNN-PT-PZ may be included in the thin film 45 made of Pt at a volume equal to or larger than 20 vol %. Screen printing may be employed to form the thin films 45, for example.

Exposed areas are kept on the second green sheet strip 44b between the adjacent ones of the thin films 45. The exposed area is allowed to completely cross the second green sheet strip 44b in the lateral direction perpendicular to the longitudinal direction of the second green sheet strip 44b. The centerlines 46 can be defined on the individual thin films 45 in the lateral direction. The centerlines 47 can also be defined on the individual exposed areas. The space L between the centerlines 46, 47 is set equal to the length of the first and second elongated piezoelectric actuators 28, 29.

Figure 8:
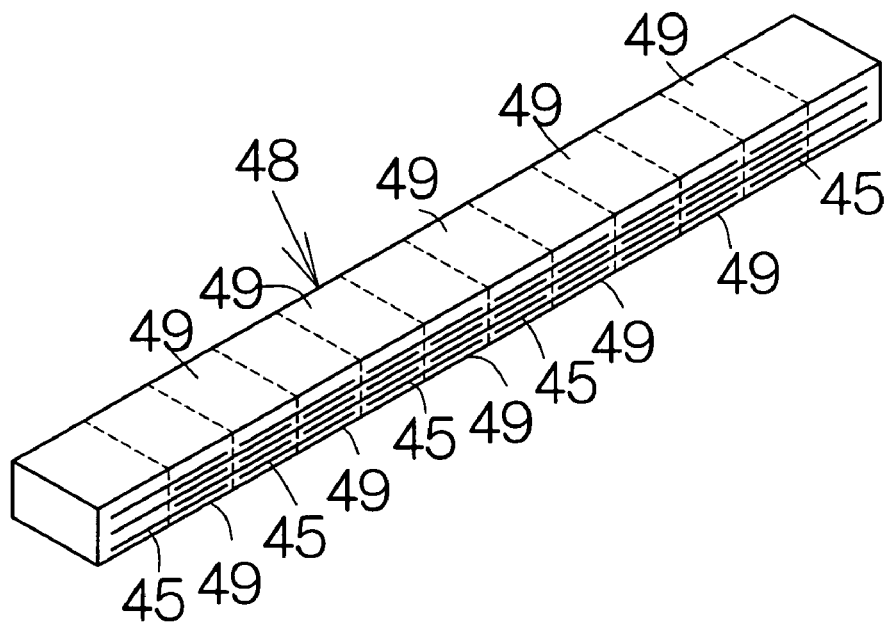
FIG. 8 is a perspective view schematically illustrating a stack of the green sheet strips employed in making the piezoelectric actuator.

The second green sheet strips 44b are then sequentially superposed one another. The number of the second green sheet strip 44b may be set dependent upon the amount of the intended shrinkage in the first and second elongated piezoelectric actuators 28, 29. The centerlines 47 of the exposed areas on the upper second green sheet strips 44b are aligned with the centerlines 46 of the thin films 45 on the lower second green sheet strips 44b. One or more first green sheet strips 44a may be interposed between the upper and lower second green sheet strips 44b. The number of the interposed first green sheet strip 44a may be set dependent upon the intended thickness of the active layer for the first and second elongated piezoelectric actuators 28, 29. The first green sheet strips 44a may also be superposed over the lower surface of the lowest second green sheet strip 44b and/or the upper surface of the uppermost second green sheet strips 44b. A stack 48 of the green sheet strips 44a, 44b can finally be obtained as shown in FIG. 8.

Figure 9:
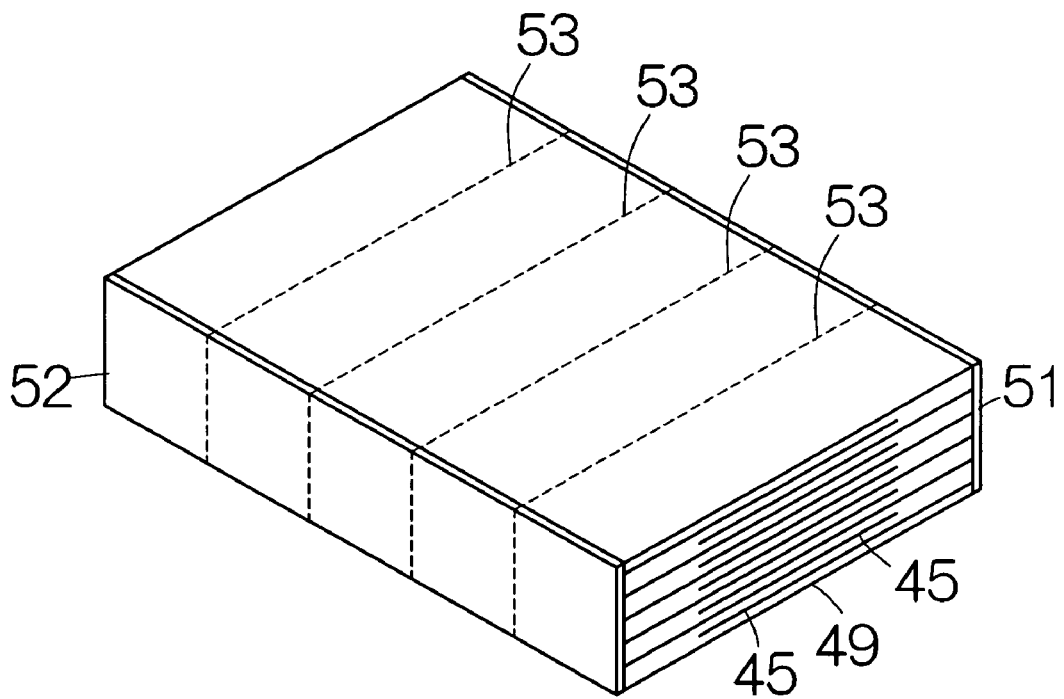
FIG. 9 is an enlarged perspective view illustrating a stack segment including electrode thin films.

The stack 48 is then baked at the temperature of 1,050 degrees Celsius, for example, in the normal atmosphere. The superposed first and second green sheet strips 44a, 44b get integrated based on the baking. Thereafter, the stack 48 is cut and divided along the aforementioned centerlines 46, 47. Stack segments 49 are obtained in this manner. Each stack segment 49 includes a row of the elongated piezoelectric actuators. As shown in FIG. 9, electrode thin films 51, 52 are formed to extend on the stack segment 49 over the cut surfaces of the segment.

The first and second elongated piezoelectric actuators 28, 29 are then cut out of the stack segment 49. The cutting is effected along planes 53 intersecting the aforementioned cut surfaces by right angles. The first and second elongated piezoelectric actuators 28, 29 are thus obtained. The first and second elongated piezoelectric actuators 28, 29 are coupled with each other. A jig may be employed to receive the elongated piezoelectric actuators 28, 29 to couple the actuators 28, 29. The first electrically conductive member 42 is formed between the first terminal electrode layer 33 of the first elongated piezoelectric actuator 28 and the second terminal electrode layer 34 of the second elongated piezoelectric actuator 29. The second electrically conductive member 43 is formed between the second terminal electrode layer 34 of the first elongated piezoelectric actuator 28 and the first terminal electrode layer 33 of the second elongated piezoelectric actuator 29. Wire bonding method is employed to form the first and second electrically conductive members 42, 43, for example. The first and second elongated piezoelectric actuators 28, 29 are then adhered to the plate member 24. The connecting terminals 38 are subsequently formed between the first terminal electrode layers 33 of the first and second elongated piezoelectric actuators 28, 29 and the terminal pads 39. The flying head slider 21 is finally fixed to the first and second elongated piezoelectric actuators 28, 29 after the connecting terminals 38 have been formed.

Figure 10:
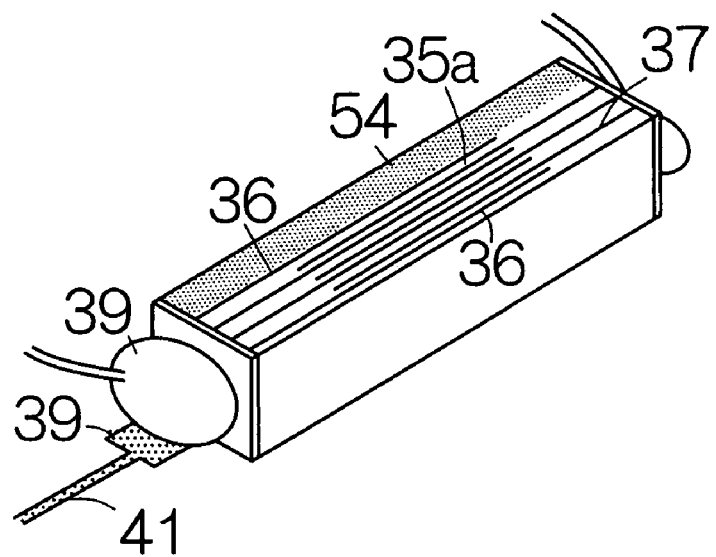
FIG. 10 is an enlarged perspective view schematically illustrating the structure of a piezoelectric actuator according to a second embodiment of the present invention.

FIG. 10 illustrates the first and second elongated piezoelectric actuators 28, 29 according to a second embodiment of the present invention. Inactive layers 54 are fixed to at least any one of the exposed surfaces of the first and second inside electrode layers 36, 37 between the base ends 28a, 29a and the tip ends 28b, 29b in the first and second elongated piezoelectric actuators 28, 29 according to the second embodiment. The inactive layers 54 may be made of PNN-PT-PZ, for example. Since no electric path of the inside electrode layers 36, 37 is established within the inactive layers 54, no elongation or shrinkage is achieved in the piezoelectric material. When the inactive layers 54 are to be formed during the aforementioned method of forming the first and second elongated piezoelectric actuators 28, 29, a large number of the first green sheet strips 44a may be overlaid on the lower surface of the lowest second green sheet strip 44b as well as on the upper surface of the upper most second green sheet strip 44b. Like reference numerals are attached to structure or components equivalent to those of the aforementioned head suspension assembly 18 and the first and second elongated piezoelectric actuators 28, 29.

Figure 11:
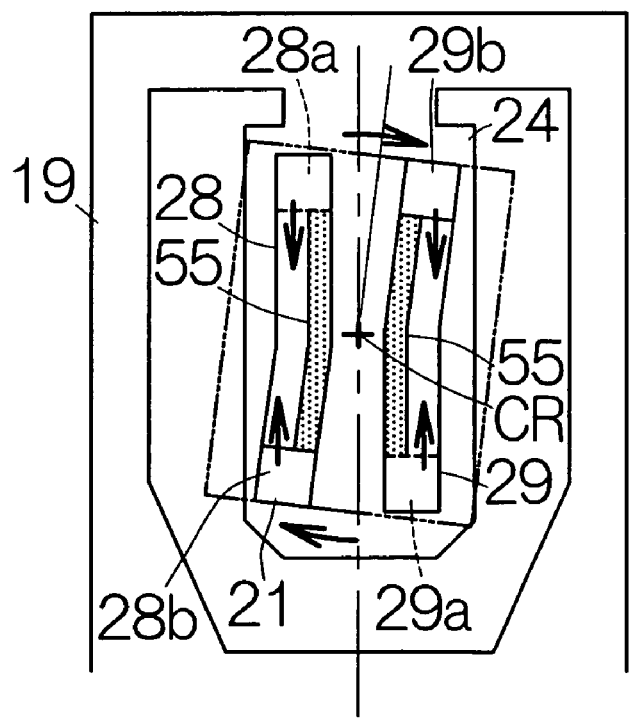
FIG. 11 is an enlarged plane view of the plate member for schematically illustrating the action of the piezoelectric actuators according to a modified example of the second embodiment.

When a driving current is supplied, as shown in FIG. 11, for example, the stack 35 of the piezoelectric ceramic layers 35a, namely the active layers of the first and second elongated piezoelectric actuators 28, 29 get shrunk. The active layers serves to pull the tip ends 28b, 29b toward the base ends 28a, 29a. On the other hand, the inactive layers 54 fail to shrink. The inactive layers 54 serves to hinder the shrinkage of the stack 35 of the piezoelectric ceramic layers 35a. The first and second elongated piezoelectric actuators 28, 29 are thus forced to bend in response to supply of the driving current. The bent elongated piezoelectric actuators 28, 29 enable a change in the attitude of the flying head slider 21 around the rotational axis CR in the same manner as described above.

Figure 12:
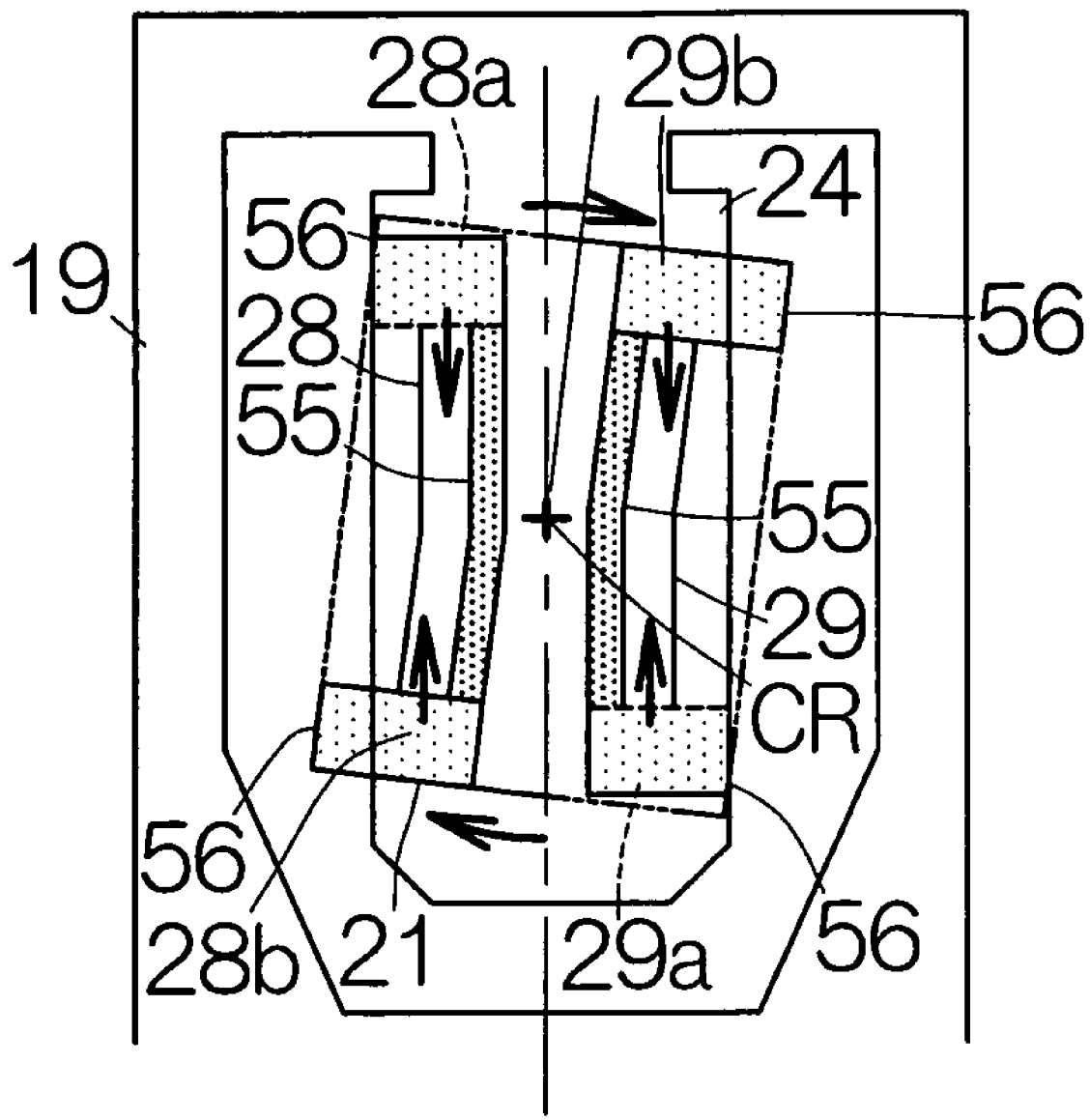
FIG. 12 is an enlarged plan view of the plate member for schematically illustrating the structure of piezoelectric actuators according to a third embodiment of the present invention.

FIG. 12 illustrates the first and second elongated piezoelectric actuators 28, 29 according to a third embodiment of the present invention. Reinforcement protrusions 56 are integrally formed on the base ends 28a, 29a and/or the tip ends 28b, 29b of the first and second elongated piezoelectric actuators 28, 29 according to the third embodiment. The first and second elongated piezoelectric actuators 28, 29 of the type allow contact areas to increase between the first and second elongated piezoelectric actuators 28, 29 and the plate member 24 as well as the flying head slider 21. The first and second elongated piezoelectric actuators 28, 29 are allowed to enjoy an improved bonding to the plate member 24 as well as the flying head slider 21. When the protrusions 56 are to be formed during the aforementioned method of forming the first and second elongated piezoelectric actuators 28, 29, the first and second elongated piezoelectric actuators 28, 29 may be punched out from the stack segment 49 in a pattern corresponding to addition of the protrusions 56. Like reference numerals are attached to structure or components equivalent to those of the aforementioned head suspension assembly 18 and the first and second elongated piezoelectric actuators 28, 29.

What is claimed is:
1. A microscale driving unit comprising:
a support member;
a driven member;
a first elongated piezoelectric actuator extending in a first direction from a base end fixed to the support member, said first elongated piezoelectric actuator being fixed to the driven member at a tip end of the actuator;
a second elongated piezoelectric actuator extending in a second direction from a base end fixed to the support member, said second elongated piezoelectric actuator being fixed to the driven member at a tip end of the actuator, said second direction being set antiparallel to the first direction;
a first electrically conductive member connecting the base end of the first elongated piezoelectric actuator to the tip end of the second elongated piezoelectric actuator; and
a second electrically conductive member connecting the base end of the second elongated piezoelectric actuator to the tip end of the first elongated piezoelectric actuator.

2. The microscale driving unit according to claim 1, wherein said electrically conductive members are made of wire bonding materials.

3. The microscale driving unit according to claim 2, wherein said elongated piezoelectric actuator is made of a layered material, said layered material comprising:
- first inside electrode layers extending from exposed ends near the base end toward the tip end;
- second inside electrode layers extending from exposed ends near the tip end toward the base end between the adjacent ones of the first inside electrode layers; and
- active layers interposed between the first and second inside electrode layers.

4. The microscale driving unit according to claim 3, wherein said elongated piezoelectric actuator comprises:
- a first terminal electrode attached to the exposed end near the base end; and
- a second terminal electrode attached to the exposed end near the tip end.

5. The microscale driving unit according to claim 4, wherein said active layer is made of PNN-PT-PZ.

6. The microscale driving unit according to claim 5, wherein said first and second elongated piezoelectric actuators are arranged symmetrically around a rotational axis of the driven member.

* * * * *